(12) United States Patent
Ko

(10) Patent No.: US 7,377,829 B2
(45) Date of Patent: May 27, 2008

(54) MANUFACTURING METHOD OF AN ORGANIC ELECTROLUMINESCENCE DEVICE WITH LIGHT AND DARK BLUE EMITTING LAYERS

(75) Inventor: Chung-Wen Ko, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 327 days.

(21) Appl. No.: 11/308,657

(22) Filed: Apr. 19, 2006

(65) Prior Publication Data
US 2006/0199460 A1 Sep. 7, 2006

Related U.S. Application Data

(62) Division of application No. 10/708,176, filed on Feb. 13, 2004, now Pat. No. 7,064,481.

(30) Foreign Application Priority Data
Oct. 29, 2003 (TW) ............................. 92129999 A

(51) Int. Cl.
*H01J 9/00* (2006.01)
*H01J 9/24* (2006.01)
(52) U.S. Cl. ........................................ 445/24; 445/25
(58) Field of Classification Search ................ 313/498, 313/502, 503, 504, 506, 512; 445/24, 25; 427/66
See application file for complete search history.

(56) References Cited

U.S. PATENT DOCUMENTS 5,126,214 A * 6/1992 Tokailin et al. ............. 428/690
5,909,081 A * 6/1999 Eida et al. .................. 313/504

* cited by examiner

*Primary Examiner*—Toan Ton
*Assistant Examiner*—Kevin Quarterman
(74) *Attorney, Agent, or Firm*—Jianq Chyun IP Office

(57) ABSTRACT

An organic electroluminescent device is provided. The device includes a substrate, an anode, an emitting layer and a cathode. The anode is disposed on the substrate, the emitting layer is disposed on the anode, and the cathode is disposed on the emitting layer. The emitting layer is constructed by a dark-blue emitting layer/light-blue emitting layer/reddish orange emitting layer or a light-blue emitting layer/dark-blue emitting layer/reddish orange emitting layer. Since the dark-blue emitting layer has an excellent bright blue light color and high brightness, and the light-blue emitting layer has a long service life, and therefore, organic electroluminescent device of the present invention has an excellent blue light color, high brightness and long service life.

7 Claims, 7 Drawing Sheets

MANUFACTURING METHOD OF AN ORGANIC ELECTROLUMINESCENCE DEVICE WITH LIGHT AND DARK BLUE EMITTING LAYERS

CROSS-REFERENCE TO RELATED APPLICATION

This is a divisional application of application Ser. No. 10/708,176, filed on Feb. 13, 2004, which claims the priority benefit of Taiwan patent application serial no. 92129999, filed on Oct. 29, 2003 and is now allowed. The entirety of each of the above-mentioned patent applications is hereby incorporated by reference herein and made a part of this specification.

BACKGROUND OF THE INVENTION

1. Field of the Invention

The present invention relates to a manufacturing method of an organic electroluminescence (OEL) device. More particularly, the present invention relates to a manufacturing method of an organic electroluminescent device having an excellent luminous efficiency, long service life and high brightness.

2. Description of the Related Art

In recent years, computer, communication and consumer (3C) products have become the major trend of high technology. More particularly, the portable electronic devices are also the essential products of development. Essentially, a display device is required in all of the products. To date, the display may be classified into an organic electroluminescent display (OELD), a plasma display panel (PDP), a liquid crystal display (LCD), a light emitting diode display, a vacuum fluorescent display, a field emission display (FED) and an electro-chromic display. Among the above mentioned displays, the organic electroluminescent display, has the advantages of self-luminance, no view angle dependence, low power consumption, simple manufacturing process, low cost, low operation temperature range, high response speed and high full color resolution etc. Therefore, the organic electroluminescent display has huge potential applications and has become the main trend for the next generation displays.

The organic electroluminescent device performs display by using the self-luminescent property of the organic luminescent material. The structure of the organic electroluminescent device includes at least two electrodes and an emitting layer (EMT) between the electrodes. When a current is applied via the diode and the cathode, electron holes from the anode and electrons form the cathode are combined in the emitting layer, and excitons are generated, therefore, lights having a variety of colors can be generated by using a variety of materials having different properties. The above description describes the emitting principle of electroluminescence. In order to improve the luminous efficiency of the organic electroluminescent device, the organic luminescent layer may be formed from the small molecules of the organic electroluminescence by the vacuum evaporation method. A structure of a conventional organic electroluminescent device is described in the following.

FIG. 1 is a cross-sectional view schematically illustrating a conventional organic electroluminescent device. Referring to FIG. 1, a conventional electroluminescent device 100 includes a substrate 110, an anode 120 formed on the substrate 110, a emitting layer 130 formed on the anode 120, and a cathode 140 formed on the emitting layer 130. Moreover, a cover 160 is formed on the cathode 140 for covering and packaging the organic electroluminescent device 100.

In order to emit a white light from the conventional organic electroluminescent device 100, the emitting layer 130 is generally constructed by a blue emitting layer 132 and a reddish orange emitting layer 134. Therefore, a white light is generated by the blue light and reddish orange light that are complementary color. However, because the service life of the conventional blue emitting material is short, i.e., the decay of the blue light emitting material is faster than that of the reddish orange emitting material. Therefore, when the blue emitting layer 132 starts to decay, the white light emitted from the organic electroluminescent device 100 will have chromatic aberration.

SUMMARY OF THE INVENTION

Therefore, one object of the present invention is to provide an organic electroluminescent device having an excellent luminous efficiency, long service life and high brightness by providing a dark-blue emitting layer and a light-blue emitting layer, and manufacturing method thereof.

In order to achieve the above objects and other advantages of the present invention, an organic electroluminescent device is provided. The organic electroluminescent device includes a substrate, an anode, an emitting layer and a cathode. The anode is disposed on the substrate, and the emitting layer is disposed on the anode. The emitting layer includes a blue emitting layer and a reddish orange emitting layer, and the blue emitting layer includes a dark-blue emitting layer and a light-blue emitting layer. The cathode is disposed on the emitting layer.

In a preferred embodiment, the blue emitting layer is, for example but not limited to, disposed on the anode, and the reddish orange emitting layer, for example but not limited to, is disposed between the blue emitting layer and the cathode. The dark-blue emitting layer, for example but not limited to, is disposed on the anode, and the light-blue emitting layer, for example but not limited to, is disposed between the dark-blue emitting layer and the reddish orange emitting layer. Alternatively, the light-blue emitting layer, for example but not limited to, is disposed on the anode, and dark-blue emitting layer, for example but not limited to, is disposed between the light-blue emitting layer and the reddish orange emitting layer.

In another preferred embodiment, the reddish orange emitting layer may also be disposed on the anode, and blue emitting layer is disposed between the reddish orange emitting layer and the cathode. The dark-blue emitting layer is on the reddish orange emitting layer, and the light-blue emitting layer is disposed between the dark-blue emitting layer and the cathode. Alternatively, the light-blue emitting layer is disposed on the reddish orange emitting layer, and the dark-blue emitting layer is disposed between the light-blue emitting layer and the cathode.

In order to achieve the above objects and other advantages of the present invention, a manufacturing method of an organic electroluminescent device is provided. The manufacturing method includes, for example but not limited to, the following steps. First, an anode is formed on a substrate. Next, an emitting layer is formed on the anode, wherein the emitting layer includes a blue emitting layer and a reddish orange emitting layer, and the blue emitting layer includes a dark-blue emitting layer and a light-blue emitting layer. Then a cathode is formed on the emitting layer.

In a preferred embodiment, the method of forming the emitting layer includes, for example but not limited to, forming a blue emitting layer on the anode, and forming a reddish orange emitting layer on the blue emitting layer. The method of forming the blue emitting layer includes, for example but not limited to, forming dark-blue emitting layer on the anode, and forming light-blue emitting layer on the dark-blue emitting layer. Alternatively, the method of forming the blue emitting layer includes, for example but not limited to, forming light-blue emitting layer on the anode, and then forming dark-blue emitting layer on the light-blue emitting layer.

In another preferred embodiment, the method of forming the emitting layer includes, for example but not limited to, forming reddish orange emitting layer on the anode, and then forming a blue emitting layer on the reddish orange emitting layer. The method of forming the blue emitting layer includes, for example but not limited to, forming a dark-blue emitting layer on the reddish orange emitting layer, and then forming light-blue emitting layer on the dark-blue emitting layer. Alternatively, the method of forming the blue emitting layer includes, for example but not limited to, forming a light-blue emitting layer on the reddish orange emitting layer, and then forming dark-blue emitting layer on the light-blue emitting layer.

Accordingly, the blue emitting layer includes a dark-blue emitting layer and light-blue emitting layer, and the dark-blue emitting layer has an excellent blue light color and brightness, and the light-blue emitting layer has a high luminous efficiency and a long service life, Therefore, the organic electroluminescent device of the present invention has the advantages of having brighter blue color, high brightness, high luminous efficiency and long service life.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF SOME EMBODIMENTS

Figure 1:
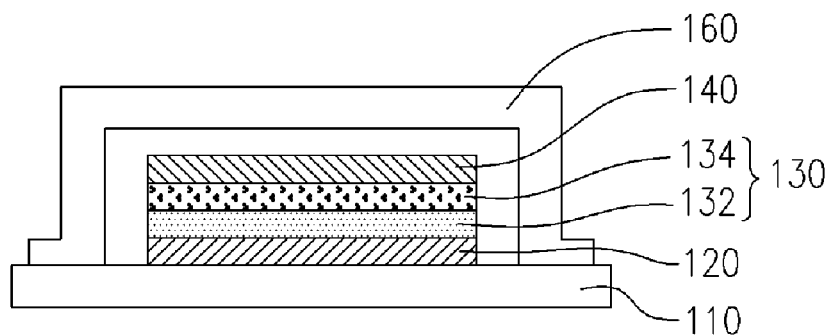
FIG. 1 is a cross-sectional view schematically illustrating a conventional organic electroluminance device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

FIG. 2A to FIG. 2D are cross-sectional views illustrating four organic electroluminescent devices emitting a white light according to the preferred embodiments of the present invention. First, referring to FIG. 2A, the organic electroluminescent device 200 includes, for example but not limited to, a substrate 210, an anode 220, an emitting layer 230 and a cathode 240. The substrate 210 includes, for example but not limited to, a glass substrate, a plastic substrate or a flexible substrate. The anode 220 is disposed on the substrate 210. Since the anode 220 is provided for injecting electron holes into the emitting layer 230 effectively, it is preferable that the material of the anode 210 has a higher work function. The material of the anode 220 includes, for example but not limited to, an indium tin oxide (ITO), tin oxide, gold (Au), silver (Ag), platinum (Pt) or copper (Cu). The emitting layer 230 is disposed on the anode 220, and the cathode 240 is disposed on the emitting layer 230. The cathode 240 is provided for injection the electrons into the emitting layer 230 effectively. The cathode 240 includes, for example but not limited to, a single conductive layer, and the material of the cathode 240 includes, for example but not limited to, an aluminum (Al). calcium (Ca), magnesium (Mg) or silver (Ag) that has a low work function. The cathode 240 may be double conductive layers, and the material of the cathode 240 includes, for example but not limited to, lithium fluoride/aluminum, barium/aluminum, magnesium/silver, calcium/silver.

Moreover, the emitting layer 230 may include, for example but not limited to, a blue emitting layer 232 and a reddish orange emitting layer 234. Since the blue light emitted from the blue emitting layer 232 and the reddish orange light emitted from the reddish orange emitting layer 234 are complementary color, an organic electroluminescent device 200 emitting a white light can be achieved.

Figure 3A:
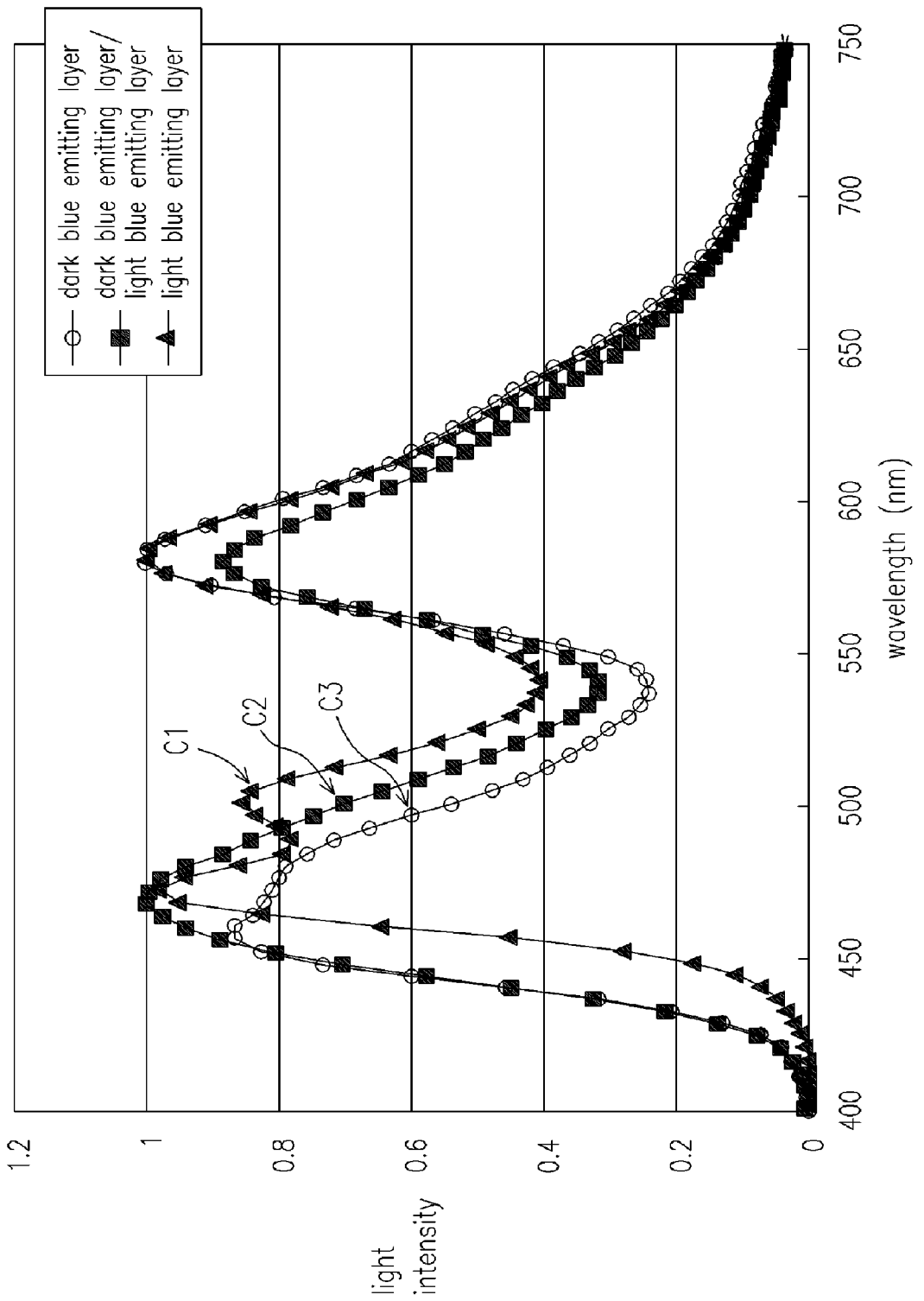
FIG. 3A is a spectrum of the light emitted from a dark-blue emitting layer, a light-blue emitting layer and a dark-blue emitting layer combined with a light-blue emitting layer.
Figure 3B:
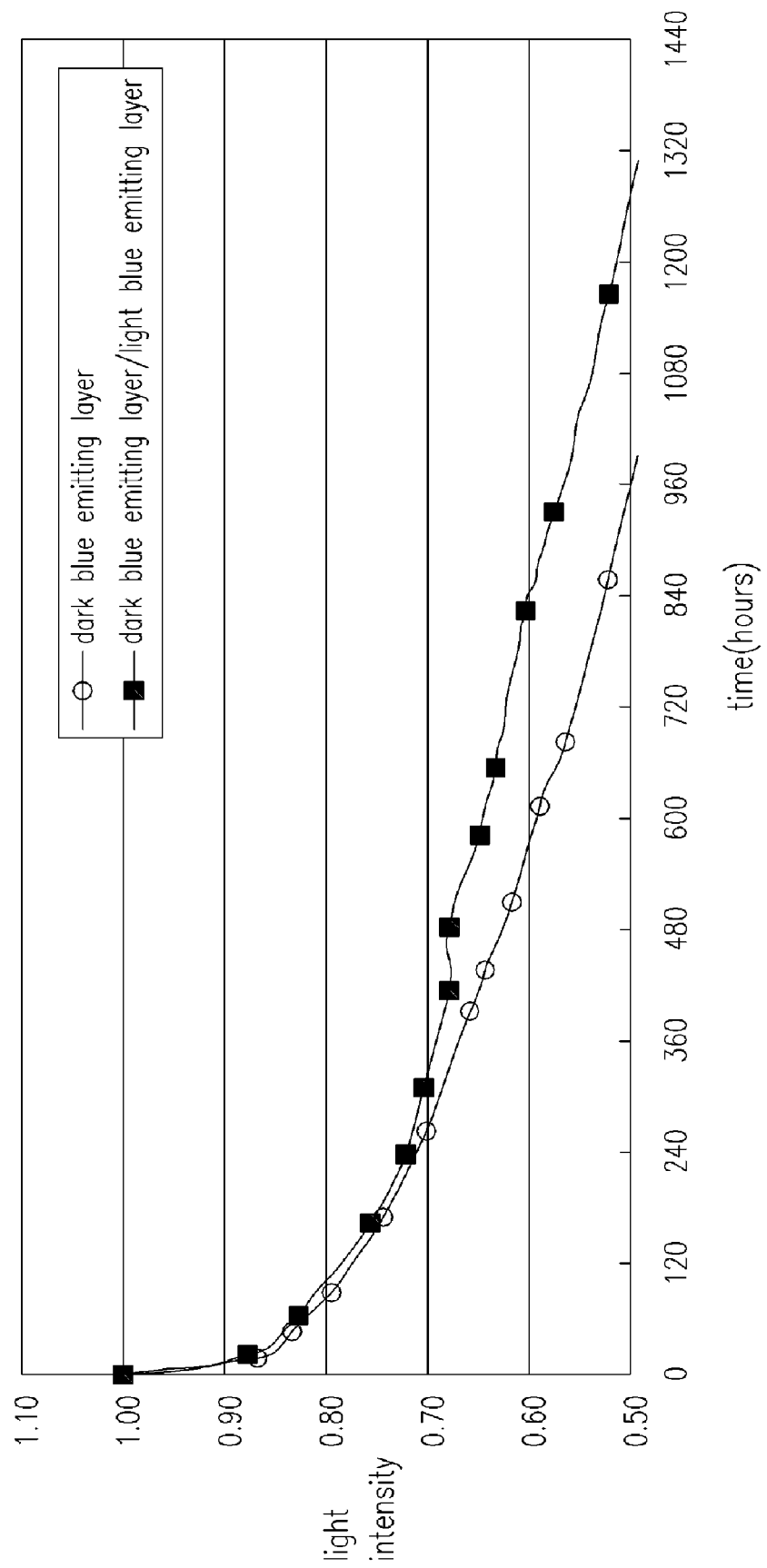
FIG. 3B is a diagram illustrating the lifetime of the emitted light from a dark-blue emitting layer and a dark-blue emitting layer combined with a light-blue emitting layer.

It is noted that in the present invention, the blue emitting layer 232 may include, for example but not limited to, a dark-blue emitting layer 232$a$ and a light-blue emitting layer 232$b$. FIG. 3A is a spectrum of the light emitted from a dark-blue emitting layer, a light-blue emitting layer and a dark-blue emitting layer combined with a light-blue emitting layer. FIG. 3B is a diagram illustrating the service life of the emitted light from a dark-blue emitting layer and a dark-blue emitting layer combined with a light-blue emitting layer. In FIG. 3A, the horizontal axis is wavelength and the vertical axis is light intensity. It is noted that, in curve C3, the wavelength of the light emitted from the dark-blue emitting layer is shorter, therefore a blue color having a better brightness and performance is obtained after passing through the color filter. In addition, in curve C1, the light emitted from the light-blue emitting layer includes a portion of blue light and a portion of green light, and the curve C1 can be provided for enhancing the luminous efficiency and the whole brightness of the white light organic electroluminescent device. In curve C2, when the dark-blue emitting layer and the light-blue emitting layer are provided simultaneously, the color gamut of the blue light is widest. Next, in FIG. 3B, the horizontal axis is time and the vertical axis is light intensity. A light-blue emitting layer having a more stable morphology has a longer service life and can stabilize the adjacent material layer.

Figure 2A:
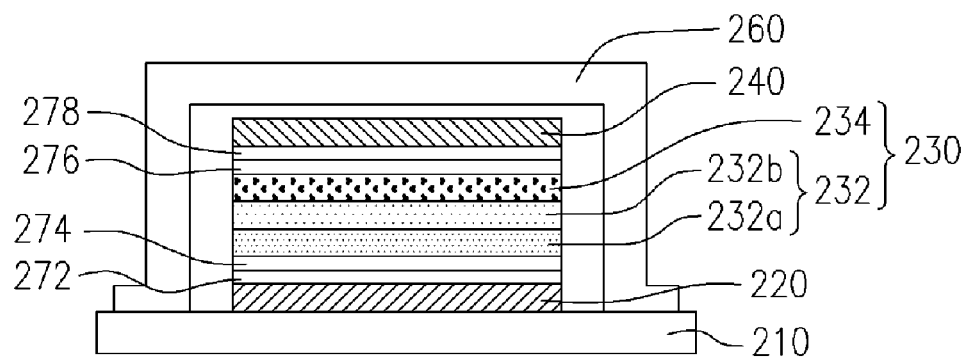
FIGS. 2A to 2D are cross-sectional views illustrating four organic electroluminescence devices having a white light according to the preferred embodiments of the present invention.

In the embodiments of the emitting layer of the invention, the blue emitting layer 232, for example but not limited to, is disposed on the anode 220 and the reddish orange emitting layer 234, for example but not limited to, is disposed between the blue emitting layer 232 and the cathode 240. Referring to FIG. 2A, the dark-blue emitting layer 232a, for example, is disposed on the anode 220, and the light-blue emitting layer 232b, for example, is disposed between the dark-blue emitting layer 232a and the reddish orange emitting layer 234. Alternatively, referring to FIG. 2B, the light-blue emitting layer 232b, for example, is disposed on the anode 220, and the dark-blue emitting layer 232a, for example but not limited to, is disposed between the light-blue emitting layer 232b and the reddish orange emitting layer 234.

Figure 2B:
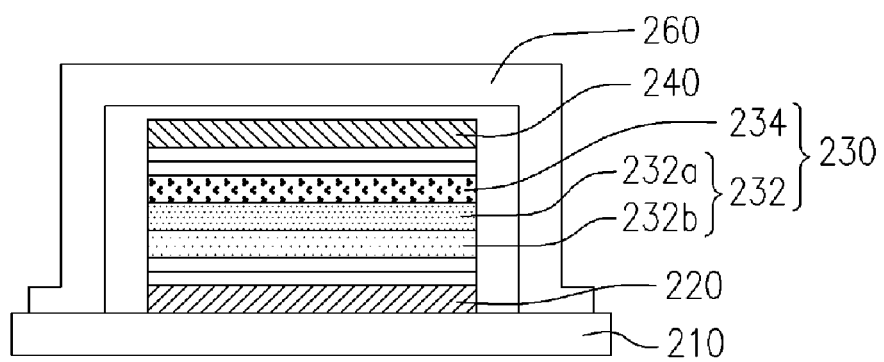
Figure 2C:
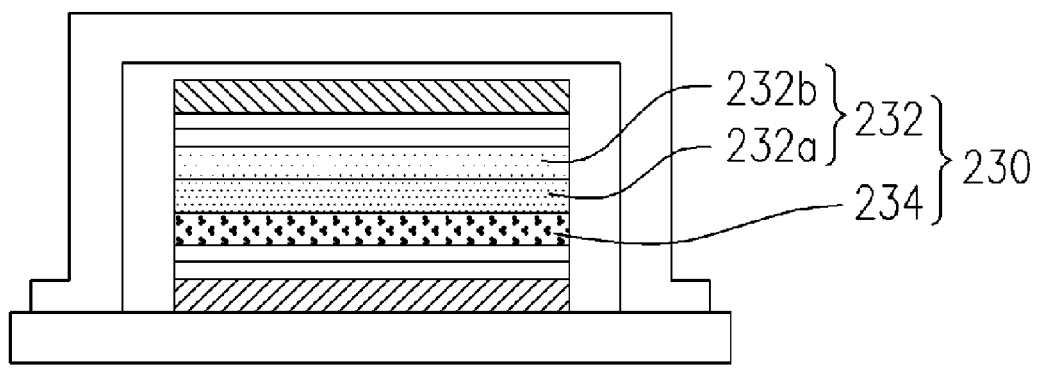

Alternatively, the reddish orange emitting layer 234 may also be disposed on the anode 220, and the blue emitting layer 232 may be, for example, disposed between the reddish orange emitting layer 234 and the cathode 240. Referring to FIG. 2C, the dark-blue emitting layer 232a, for example but not limited to, is disposed on the reddish orange emitting layer 234, and the light-blue emitting layer 232b, for example but not limited to, is disposed between the dark-blue emitting layer 232a and the cathode 240. In addition, Referring to FIG. 2D, the light-blue emitting layer 232b, for example but not limited to, is disposed on the reddish orange emitting layer 234, and the dark-blue emitting layer 232a, for example but not limited to, is disposed between the light-blue emitting layer 232b and the cathode 240.

Moreover, the organic electroluminescent device 200 includes, for example but not limited to, a cover 260. The cover 260, for example, is disposed over the cathode 240 for covering and packaging the whole device.

In the present invention, the current applied to the organic electroluminescent device 200 is generally a direct current (DC), or a pulse current or a alternating current (AC). Moreover, the light of the organic electroluminescent device 200, for example but not limited to, is emitted via the anode 220, or via the cathode 240.

Referring to FIG. 2A, the organic electroluminescent device 200 further includes, for example but not limited to, a hole-injecting layer (HIL) 272, a hole-transporting layer (HTL) 274, an electron-transporting layer (ETL) 276 and an electron-injecting layer (EIL) 278. The hole-injecting layer (HIL) 272, for example but not limited to, is disposed between the emitting layer 230 and the anode 220. The hole-transporting layer (HTL) 274, for example but not limited to, is disposed between the emitting layer 230 and the hole-injecting layer (HIL) 272. Moreover, the electron-transporting layer (ETL) 276, for example but not limited to, is disposed between the emitting layer 230 and the cathode 240. The electron-injecting layer (EIL) 278, for example but not limited to, is disposed between the cathode 240 and the electron-transporting layer (ETL) 276.

Figure 4A:
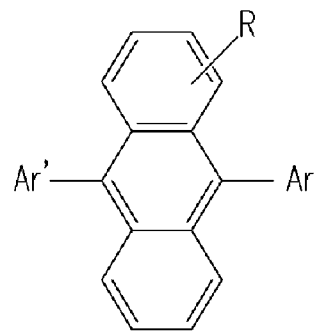
FIGS. 4A to 4K are the chemical structure of the host and the dopant of the blue emitting layer according to a preferred embodiment of the present invention.
Figure 4B:
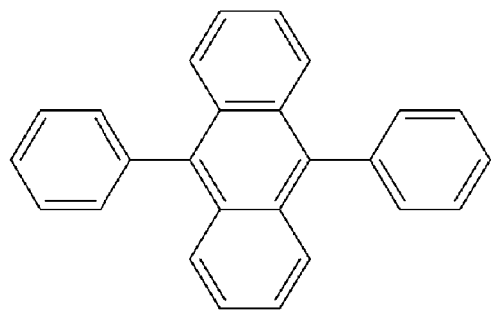
Figure 4C:
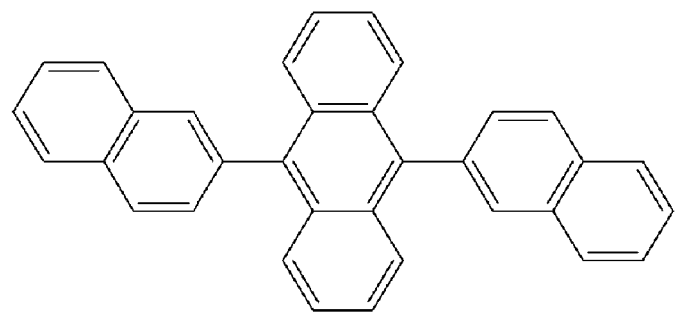
Figure 4D:
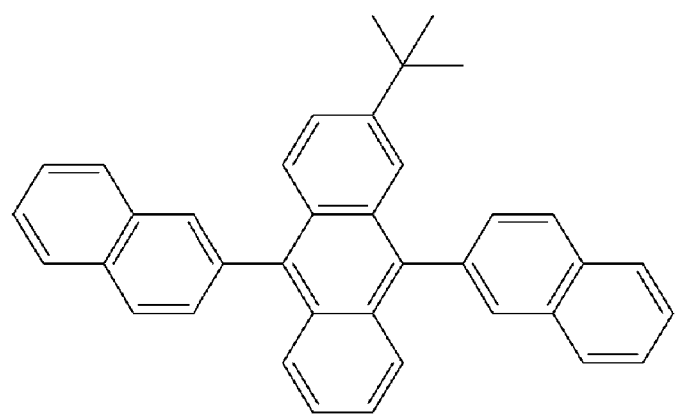
Figure 4E:
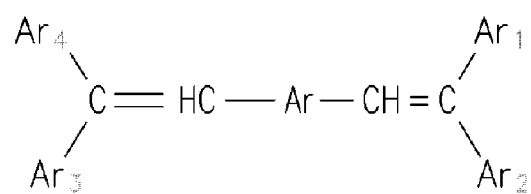
Figure 4F:
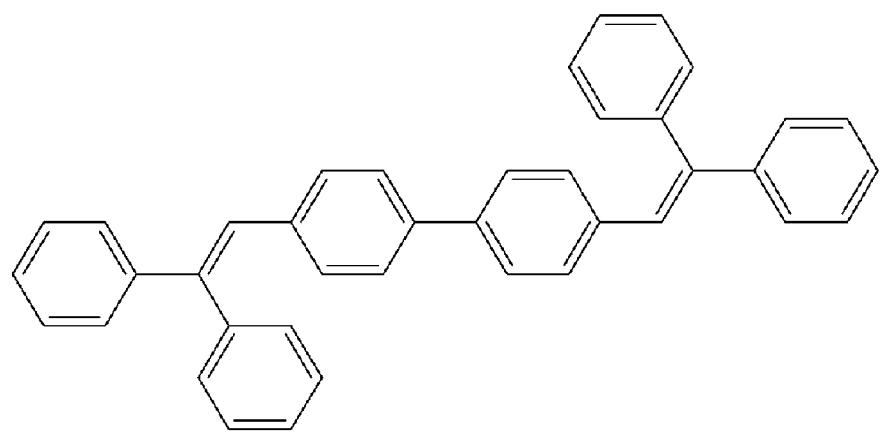
Figure 4G:
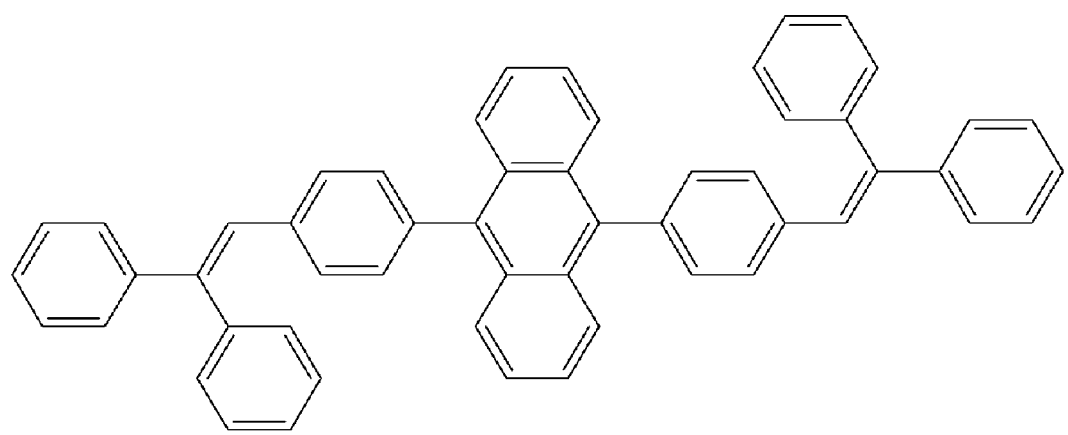
Figure 4H:
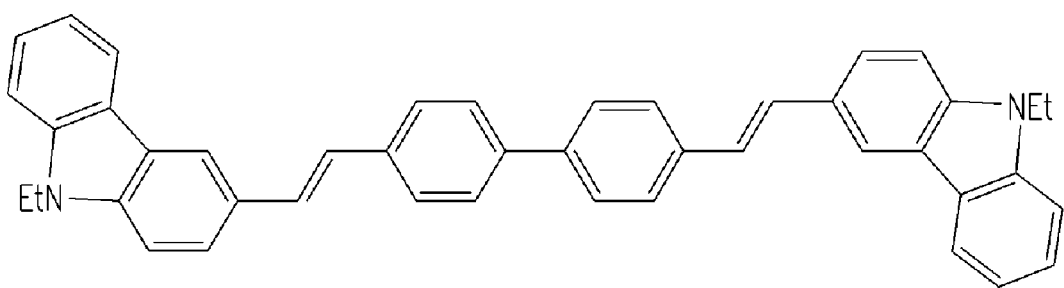
Figure 4I:
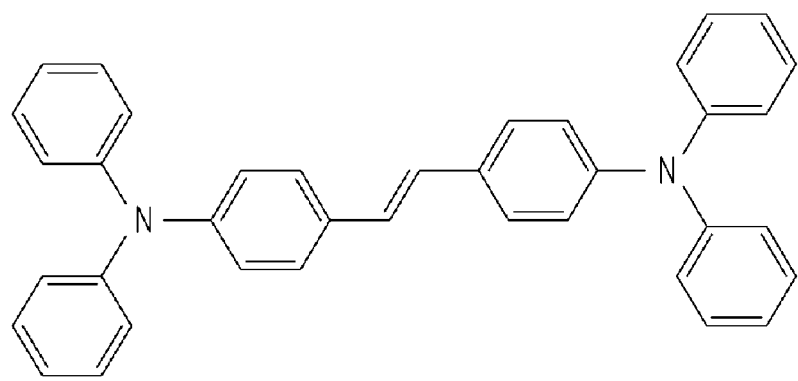
Figure 4J:
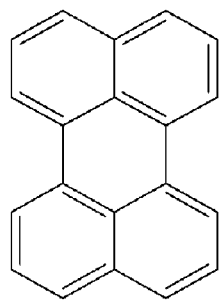
Figure 4K:
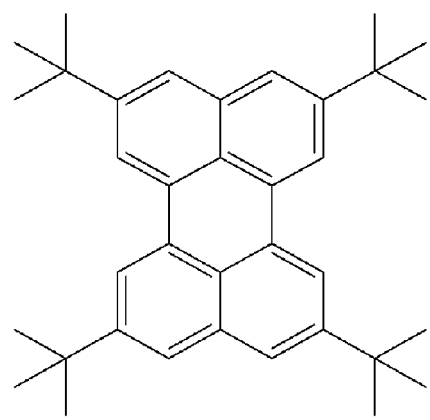

Moreover, the material of the host of the blue emitting layer 232 includes a 9,10-diarylanthracene as shown in FIG. 4A, wherein Ar and Ar' are aryl groups and R is alkyl group or aryl group. The 9,10-diarylanthracene includes, for example but not limited to, a 9,10-diphenylanthracene (DPA), a 9,10-bis(2-naphthalenyl) anthracene (ADN) or a 2-(1,1-dimethyl)-9,10-bis(2-naphthalenyl) anthracene (TBADN) as shown in FIGS. 4B to 4D sequentially. The host of the blue emitting layer 232 may also includes, for example but not limited to, distyrylarylene (DSA) as shown in FIG. 4E, wherein Ar, Ar1, Ar2, Ar3 and Ar4 are aryl groups. The distyrylarylene (DSA) includes, for example but not limited to, a DPVBi or a 9,10-bis[4-(2,2-diphenylethenyl)phenyl]anthracene as shown in FIG. 4F and FIG. 4G. Moreover, the dopant of the blue emitting layer 232 includes, for example but not limited to, an amino substituted distyrylarylene (DSA-amine) as shown in FIG. 4H or FIG. 4I, or a perylene compound as shown in FIG. 4J or FIG. 4K. Whether the emitting layer is a dark-blue emitting layer 232a or a light-blue emitting layer 232b is decided by the doping concentration of the dopant, wherein the doping concentration is, for example but not limited to, in a range of about 0.01% to about 50%.

Next, referring to FIG. 2A to FIG. 2D, the manufacturing method of the organic electroluminescence device 200 of the present invention is provided. The manufacturing method includes the following steps. First, an anode 220 is formed on the substrate 210. Next, an emitting layer 230 is formed on the anode 220. The emitting layer 230 may include, for example but not limited to, a blue emitting layer 232 and a reddish orange emitting layer 234. Moreover, the blue emitting layer 232 may include a dark-blue emitting layer 232a and a light-blue emitting layer 234a. Then a cathode 240 is formed on the emitting layer 230. In addition, the method of forming the anode 220 and the cathode 240 includes, for example but not limited to, an evaporation method or a sputtering method.

Figure 2D:
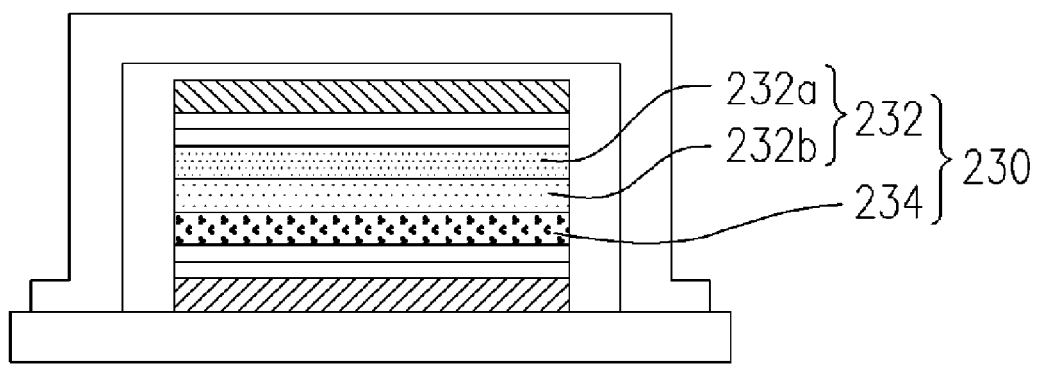

Moreover, the method of forming the emitting layer 230 includes, for example but not limited to, the following four methods. (a) A dark-blue emitting layer 232a, a light-blue emitting layer 232b and a reddish orange emitting layer 234 are sequentially formed on the anode 220 as shown in FIG. 2A. (b) A light-blue emitting layer 232b, a dark-blue emitting layer 232a and a reddish orange emitting layer 234 are sequentially formed on the anode 220 as shown in FIG. 2B. (c) A reddish orange emitting layer 234, a dark-blue emitting layer 232a and a light-blue emitting layer 232b are sequentially formed on the anode 220 sequentially as shown in FIG. 2C. (d) A reddish orange emitting layer 234, a light-blue emitting layer 232b and a dark-blue emitting layer 232a are sequentially formed on the anode 220 sequentially as shown in FIG. 2D. Moreover, the method of forming each color emitting layer includes, for example but not limited to, an evaporation method or a coating method.

In addition, the manufacturing method of the organic electroluminescent device 200 of the present invention further includes, for example but not limited to, sequentially forming a hole-injecting layer (HIL) 272 and a hole-transporting layer (HTL) 274 after the step of forming the anode 220 but before the step of forming the emitting layer 230. Alternatively, the manufacturing method further includes, for example but not limited to, sequentially forming an electron-transporting layer (ETL) 276 and an electron-injecting layer (EIL) 278 after the step of forming the emitting layer 230 but before the step of forming the cathode 240. The method of forming the hole-injecting layer (HIL) 272, hole-transporting layer (HTL) 274, electron-transporting layer (ETL) 276 and electron-injecting layer (EIL) 278 include, for example but not limited to, a spin coating method.

Accordingly, since the organic electroluminescent device of the present invention provides a light-blue emitting layer and a dark-blue emitting layer, the performance of the blue color, the luminous efficiency and the whole brightness thereof are excellent. Moreover, the service life of the blue light is longer than that of the conventional organic electroluminescent device, thus the chromatic aberration can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of an organic electroluminescent device, comprising:
    forming a anode on a substrate;
    forming an emitting layer on the anode, wherein the emitting layer comprises a blue emitting layer and a reddish orange emitting layer, and wherein the blue emitting layer comprises a first blue emitting layer and a second blue emitting layer; and
    forming a cathode on the emitting layer.

2. The manufacturing method of claim 1, wherein the method of forming the emitting layer comprises:
    forming the blue emitting layer on the anode; and
    forming the reddish orange emitting layer on the blue emitting layer.

3. The manufacturing method of claim 2, wherein the method of forming the blue emitting layer comprises:
    forming the first blue emitting layer on the anode; and
    forming the second blue emitting layer on the first blue emitting layer.

4. The manufacturing method of claim 2, wherein the method of forming the blue emitting layer comprises:
    forming the second blue emitting layer on the anode; and
    forming the first blue emitting layer on the second blue emitting layer.

5. The manufacturing method of claim 1, wherein the step of forming the emitting layer comprises:
    forming the reddish orange emitting layer on the anode; and
    forming the blue emitting layer on the reddish orange emitting layer.

6. The manufacturing method of claim 5, wherein the step of forming the blue emitting layer comprises:
    forming the first blue emitting layer the reddish orange emitting layer; and
    forming the second blue emitting layer on the first blue emitting layer.

7. The manufacturing method of claim 5, wherein the step of forming the blue emitting layer comprises:
    forming the second blue emitting layer on the reddish orange emitting layer; and
    forming the first blue emitting layer on the second blue emitting layer.

* * * * *